United States Patent [19]

Sato

[11] Patent Number: 4,969,829
[45] Date of Patent: Nov. 13, 1990

[54] SURFACE MOUNTED CONNECTOR HAVING A SECURING TAB

[75] Inventor: Yoshio Sato, Tsukuimachi, Japan

[73] Assignee: AMP Incorporated, Harrisburg, Pa.

[21] Appl. No.: 298,808

[22] Filed: Jan. 18, 1989

Related U.S. Application Data

[63] Continuation of Ser. No. 154,829, Feb. 11, 1988, abandoned.

[30] Foreign Application Priority Data

Mar. 18, 1987 [JP] Japan .................... 62-039874

[51] Int. Cl.[5] ............................................. H01B 9/09
[52] U.S. Cl. ............................... 439/83; 439/571; 439/76
[58] Field of Search ................ 439/76, 83, 564, 571, 439/573

[56] References Cited

U.S. PATENT DOCUMENTS

| | | |
|---|---|---|
| 4,215,235 | 7/1980 | Kaufman ........................... 439/83 |
| 4,221,458 | 9/1980 | Hughes et al. ................... 439/344 |
| 4,583,807 | 4/1986 | Kaufman et al. ............. 339/17 LC |
| 4,655,517 | 4/1987 | Bryce ............................... 439/83 |
| 4,659,156 | 4/1987 | Johnescu et al. .............. 339/17 C |
| 4,678,250 | 7/1987 | Romine et al. .................. 439/83 |
| 4,682,829 | 7/1987 | Kunkle et al. ................... 439/83 |
| 4,684,200 | 8/1987 | Capp ............................... 439/84 |
| 4,693,528 | 9/1987 | Asick et al. ...................... 439/83 |
| 4,836,792 | 6/1989 | Glover ............................. 439/83 |
| 4,842,552 | 6/1989 | Frantz ............................. 439/573 |

*Primary Examiner*—P. Austin Bradley

[57] ABSTRACT

An electrical connector for mounting onto and electrical connection to a circuit board (20) comprises a dielectric housing (1) in which electrical contacts (10) are secured with connection sections (12) extending outwardly from a bottom surface of the housing (1) and electrically connected by soldering or welding to conductive members (22) of a circuit pattern on board (20). A securing tab (8) is affixed to housing (1) and extends along the bottom surface of housing (1) and is soldered or welded to a metal pad (23) in board (20) thereby securing the connector on board (20) and preventing damage to the connections between the connection sections (12) and the conductive members (22) when the housing (1) is warped as a result of temperature variations.

6 Claims, 2 Drawing Sheets

SURFACE MOUNTED CONNECTOR HAVING A SECURING TAB

This is a continuation of Ser. No. 154,829, filed Feb. 11, 1988, now abandoned.

FIELD OF THE INVENTION

The present invention relates to an electrical connector which is fixed to a circuit board to connect the board to external electrical wiring. More particularly, the present invention relates to a surface-mounted connector in which connection sections of electrical contacts retained in an insulated housing are to be electrically connected with circuit pattern of the circuit board and a securing tab for securing the connector onto the board.

BACKGROUND OF THE INVENTION

Various types of electrical connectors for electrically connecting electrical circuits on a circuit board with external electrical wiring are known. For example, one such connector is a connector which connects electrical contacts and a circuit pattern by forming connection apertures in the circuit pattern of the circuit board and inserting contact posts of the contacts in the connecting apertures. In this case, it is necessary to form the connecting apertures in the circuit board, thus a problem arises in that mounting density cannot be increased because the area occupied by the connecting apertures must be relatively large due to an increased number of contacts needed to connect an increased number of electrical wires. Therefore, a surface-mounted connector in which the connection sections of the contacts are connected with the circuit pattern on the surface of the circuit board and soldered or welded thereon has been proposed.

When using a surface-mounted connector, the housing retaining a plurality of electrical contacts must be fixed to the circuit board, and the connection sections of the contacts must be connected with the corresponding circuit pattern. In known surface-mounted connectors, both sides of the housing are secured to the circuit board. However, when this connector is used, it is difficult to cope with changes in the connector housing caused by the heat from the soldering or welding of the connection sections to the board, which have a direct effect on the soldered or welded connections. Further, an incomplete connection may occur at the soldered or welded connections as a result of cracks occurring therein or disconnections of some of the connections may occur which are caused by a mechanical load when the connector housing is connected and disconnected with a matable connector.

SUMMARY OF THE INVENTION

In consideration of the above-mentioned problems, the present invention is intended to solve the problems of changes to a surface-mounted connector occurring as a result of heat when it is mounted onto and connected to a circuit board, and of damage to the solder or weld areas connecting the connection sections of the contacts to the circuit pattern. Therefore, the connector according to this invention is composed of a dielectric housing in which a plurality of electrical contacts are secured, and connection sections of these contacts are arranged to project outward from one surface of the housing, wherein the housing is mounted on a circuit board and the connection sections are connected with the circuit pattern of the circuit board. A securing tab secured to and projecting outwardly from the one surface of the housing from which the plurality of connection sections project outwardly is joined by solder or welding to a metal pad on the surface of the circuit board.

When using the surface-mounted connector described above, the housing is mounted to the circuit board by firmly soldering or welding the securing tab, which is secured to the housing, to the metal pad on the circuit board. Therefore, even if the housing is warped by heat, the securing tab secured to the metal pad is not affected. Further, a higher junction strength against an external force affecting the housing is obtained by soldering or welding the securing tab to the metal pad. Thus, the soldered or welded connections of the connection sections of the contacts to respective conductive areas representing the circuit pattern on the circuit board are prevented from being damaged.

BRIEF DESCRIPTION OF THE DRAWINGS

The invention will now be described by way of example with reference to the following detailed description of the invention in conjunction with the accompanying drawings of which.

DETAILED DESCRIPTION OF THE INVENTION

Figure 1:
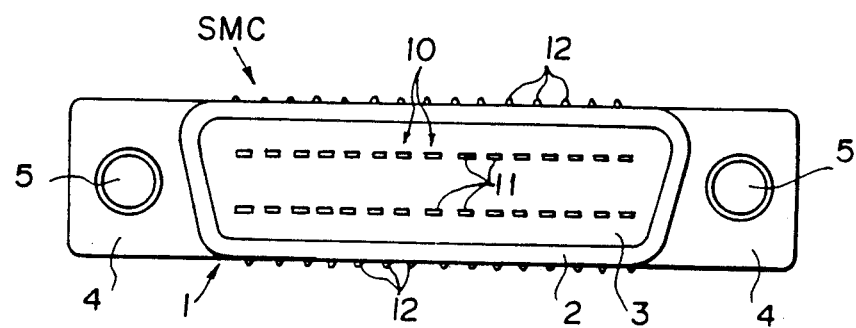
FIG. 1 is a top plan view of a surface-mounted connector with a securing tab according to the present invention.
Figure 2:
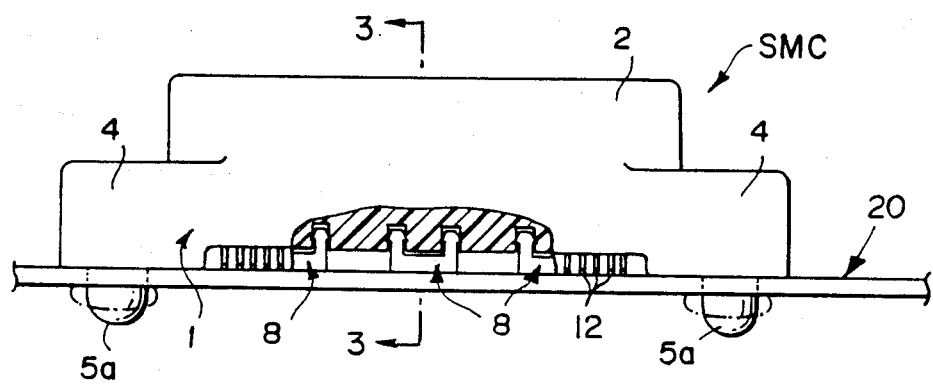
FIG. 2 is a side elevation view of the surface-mounted connector of FIG. 1 showing the connector mounted on a circuit board.
Figure 3:
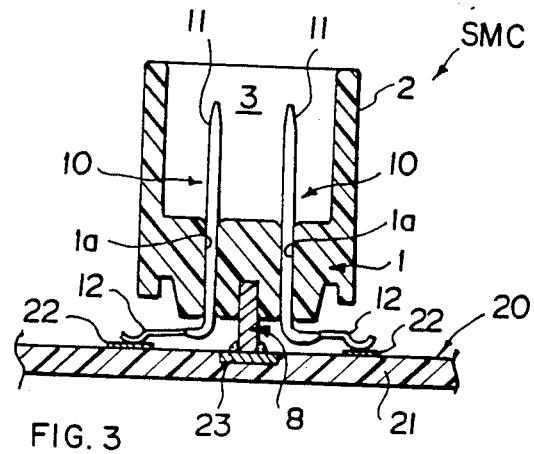
FIG. 3 is a cross-sectional view of FIG. 2 taken along the line 3—3 thereof.

Surface-mounted connector SMC as shown in FIGS. 1-3 is composed of a housing 1 of a suitable insulating material and a plurality of electrical contacts 10 which are secured in position by housing 1. Housing 1 is provided with a flange 2 and has an opening 3 therein wherein a matable complementary electrical connector (not shown) is inserted and engaged therewith while being surrounded by the flange 2. A plurality of contact-retaining holes 1a are located in housing 1 and extend from the bottom surface of housing 1 to opening 3 with each contact 10 being inserted into respective retaining holes 1a and retained therein.

As shown in FIG. 3, each contact 10 includes a contact section 11 vertically disposed in opening 3 and a connection section 12 which projects outwardly along the lower surface of housing 1. Thus, when the complementary connector is inserted in opening 3, the electrical receptacle contacts retained by the complementary connector are electrically engaged with respective contact sections 11 of contacts 10 and electrically connected therewith. When connector SMC is mounted on a circuit board 20, connection sections 12 engage with and are electrically connected with respective conductive paths of circuit pattern 22 on board 20.

Figure 4:
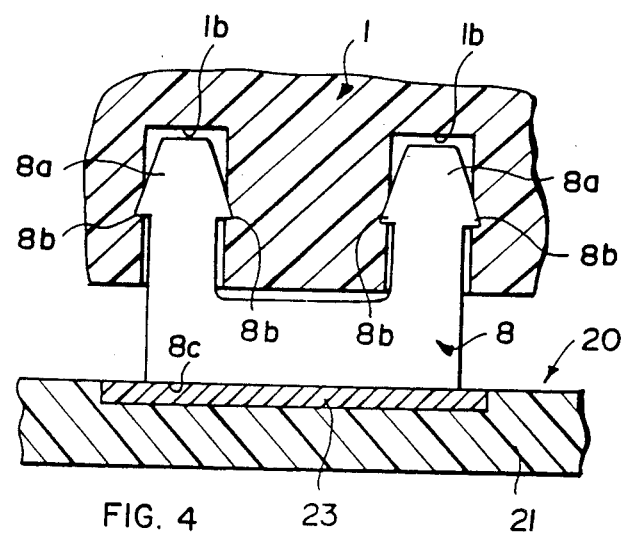
FIG. 4 is a part cross-sectional view showing the securing tab secured to the metal pad on the circuit board.

Securing tabs 8 are located at the center of the lower surface of housing 1 for mounting connector SMC on circuit board 20. FIG. 4 shows details of securing tab 8 affixed to housing 1. As shown in FIG. 4, slots 1b are located in housing 1 and they extend inwardly from the lower surface thereof, out of the plane of the lower surface. Securing tab 8 is provided with a pair of arms 8a. To fix securing tab 8 to the bottom surface of housing 1, arms 8a are pressed into slots 1b with barbs 8b on arms 8a biting into the walls of slots 1b thereby fixing securing tab 8 along the bottom surface of housing 1. The lower end 8c of securing tab 8 having a flat surface engages with metal pad 23 in the upper surface of insulation 21 of circuit board 20 when connector SMC is mounted on board 20, and securing tab 8 is then soldered or welded to metal pad 23 thereby securing the connector to board 20.

Accordingly, when connector SMC is mounted on board 20 via securing tabs 8, connection sections 12 of each of contacts 10 are engaged with respective conductive paths of circuit pattern 22 on board 20 whereafter connection sections 12 and the conductive paths of circuit pattern 22 are then soldered or welded together; thus an electrical connection therebetween is securely maintained. In this case, if the housing is slightly warped by heat created by the soldering or welding operation, this does not affect the connection between securing tab 8 and metal pad 23 in circuit board 20 because the strength of the connection between securing tab 8 and metal pad 23 is comparatively high. Therefore, the connections between connection sections 12 and the respective conductive paths of circuit pattern 22 will not be disrupted during the connecting and disconnecting of connector SMC with the complementary connector.

Housing 1 also includes projections 4 at the right and left sides thereof which project outward. Rivets 5 are fitted in holes in projections 4 and they have sections 5a extending below the bottom surfaces of projections 4 so that they can be inserted in holes in board 20 and project downward from board 20 as shown in FIG. 2. When connector SMC is mounted onto board 20 with sections 5a of rivets 5 projecting downward, they are flattened in known manner, as shown by the dotted lines in FIG. 5, which ensures that connector SMC is further securely mounted on board 20.

Thus, according to this invention, a plurality of electrical contacts of an electrical connector are retained by a housing, connection sections of the contacts are arranged and project from a bottom surface of the housing, and the connector is mounted on a circuit board so that the connection sections are connected with a circuit pattern on the circuit board. Further, since the housing is provided with a securing tab projecting outward from the bottom surface of the housing where the plurality of connection sections project, and the securing tab is soldered or welded to a metal pad on the surface of the securing tab is not effected by thermal deformation of the housing. Furthermore, a higher junction strength of the soldered or welded connections between the connection sections and the circuit pattern is obtained which will not be affected when external forces are exerted against the connector such as during connection and disconnection thereof with a complementary connector or as a result of warpage of the housing.

I claim:

1. An electrical connector for mounting onto and for electrical connection to a circuit board, the electrical connector comprising:
    a dielectric housing having a bottom surface including hole means therein extending into said housing out of the plane of said bottom surface and being positioned inwardly from the ends and sides of said housing;
    electrical contact means secured in said housing and having connection section means extending outwardly from said bottom surface of said housing for electrical connection with conductive path means of the circuit board; and
    securing tab means extending for a distance along said bottom surface of said housing and parallel to the sides thereof adjacent connection section means and having a substantially bottom planar surface adapted for attachment with metal pad means on a surface of the circuit board facing the bottom surface of the housing when the connector is mounted on the circuit board with the securing tab means thereby securing the connector onto the circuit board, said securing tab means having arm means having barb means thereon, said arm means being disposed in said hole means and said barb means digging into a wall of said hole means thereby securing said tab means to said housing.

2. An electrical connector as claimed in claim 1, wherein the securing tab means is adapted to be attached to the metal pad means by soldering.

3. An electrical connector as claimed in claim 1, wherein the securing tab means is adapted to be attached to the metal pad means by welding.

4. An electrical connector as claimed in claim 1, wherein projection means extend outwardly from respective sides of said housing, rivet means located in said projection means and having section means extending outwardly from said bottom surface of said housing and being positioned into holes in the circuit board with the section means being enlarged against the bottom surface of the circuit board thereby providing further securing means securing the connector onto the circuit board.

5. An electrical connector as claimed in claim 1, wherein the electrical contact means define at least one row of contacts.

6. An electrical connector as claimed in claim 5, wherein the securing tab means extends parallel to the row of contacts.

* * * * *